United States Patent [19]

Nam

[11] Patent Number: 5,876,509

[45] Date of Patent: Mar. 2, 1999

[54] CLEANING SOLUTION FOR CLEANING SEMICONDUCTOR DEVICE AND CLEANING METHOD USING THE SAME

[75] Inventor: Jae-woo Nam, Suwon, Rep. of Korea

[73] Assignee: Samsung Electronics Co., Ltd., Suwon, Rep. of Korea

[21] Appl. No.: 698,368

[22] Filed: Aug. 15, 1996

[30] Foreign Application Priority Data

Aug. 18, 1995 [KR] Rep. of Korea .................. 1995 25459

[51] Int. Cl.$^6$ .............................. C23G 1/01; C03C 23/00
[52] U.S. Cl. ................... 134/3; 134/2; 134/1.2; 134/1.3; 510/202; 510/206; 510/257
[58] Field of Search ................................. 134/3, 1.2, 1.3; 510/202, 206, 257

[56] References Cited

U.S. PATENT DOCUMENTS

| | | | |
|---|---|---|---|
| 4,215,005 | 7/1980 | Vander Mey | 252/153 |
| 4,343,677 | 8/1982 | Kinsbron et al. | 156/643 |
| 4,778,532 | 10/1988 | McConnell et al. | 134/10 |
| 5,078,832 | 1/1992 | Tanaka | 156/639 |
| 5,112,437 | 5/1992 | Watanabe et al. | 156/646 |

FOREIGN PATENT DOCUMENTS 0 662 705 A2  7/1995  European Pat. Off. .

OTHER PUBLICATIONS

Patent Abstracts of Japan: Vol. 16 No. 295 (C–0975), 30 Jun. 1992 & JP–A–04 080297 (Piyuretsukusu) 13 Mar. 1992.
Patent Abstracts Of Japan; Vol. 12 No. 357 (E–662), 26 Sep. 1988 & JP–A–63 114128 (Showa Denko)19 May 1988.

*Primary Examiner*—Marian C. Knode
*Assistant Examiner*—Ali R. Salimi
*Attorney, Agent, or Firm*—Jones & Volentine, L.L.P.

[57] ABSTRACT

A cleaning solution of a semiconductor device is composed of aqueous ammonia ($NH_4OH$), methanol ($CH_3OH$), hydrofluoric acid (HF) and deionized water (DI—$H_2O$), the volume ratio of $NH_4OH$ to $CH_3OH$ to DI—$H_2O$ being 1:1–50:0.1–50, and the volume of HF being 1–10,000 ppm with respect to the mixture solution of $NH_4OH$, $CH_3OH$ and DI—$H_2O$. The cleaning solution can be manufactured by simply mixing the respective compositions. The cleaning solution can strip polymers and particles within a short time, without etching or damaging the cleaned metal layers. Since the cleaning process of a semiconductor device is simplified, the processing cost is reduced and the yield and reliability are improved.

8 Claims, 4 Drawing Sheets

| CONDITION SOLUTION | WAFER BEFOR CLEANING | WAFER AFTER CLEANING |
|---|---|---|
| NP-935 (PRIOR ART) | | |
| PRESENT INVENTION | | |
| SC-1 (PRIOR ART) | | |

FIG.2

PH OF CHEMICAL OVER TIME

PIT CORROSION DENSITY
OF METAL LAYERS OVER TIME

CLEANING SOLUTION FOR CLEANING SEMICONDUCTOR DEVICE AND CLEANING METHOD USING THE SAME

BACKGROUND OF THE INVENTION

The present invention relates to a cleaning solution for cleaning a semiconductor device, and more particularly, to a cleaning solution for cleaning metal layers of a semiconductor device and a cleaning method using the same.

In manufacturing a semiconductor device, as the semiconductor device becomes highly integrated, it is very important to remove defects in the device's circuit wiring. Therefore, a cleaning process is repeatedly performed on the device, several tens of times throughout its manufacture. The cleaning process is performed for the purpose of removing undesirable foreign materials in a semiconductor device circuit. The cleaning process removes dust, particles, organic material, inorganic material and various heavy metal ions. As used herein, an etching process is broadly included within the definitional boundaries of a cleaning process.

In cleaning a semiconductor substrate having metal layers formed thereon, e.g., aluminum layers, a cleaning solution comprised of an amine (such as aminoethyl piperidine, isopropyl amine, hydroxyethyl morpholine, amino alcohol, diethylenetriamine) and a solvent (such as N-methyl-2-pyrrolidone (NMP), dimethyl sulfoxide (DMSO), dimethylacetamide (DMAC), dimethyformamide (DMF), sulfotane, γ-butyrolactone (BLO), or a mixture thereof), is used for stripping polymers generated in forming contact holes in photoresists formed on the metal layers and intermetal dielectric films formed between the metal layers.

However, in such stripping operations, substantial metal layers are chemically corroded, which reduces their ability to maintain the resistance and conductivity as designed. In order to minimize the corrosion of the metal layers and to easily strip the polymers generated during a dry-etching process, another type cleaning solution (e.g., NP-935) containing DMAC and diethanolamine, is used in the cleaning process. However, the capability of removing particles with the NP-935 process is poor. Thus, after the above cleaning process, it is necessary to perform a further cleaning process adopting a cleaning solution dedicated to the removal of the particles (e.g, SC-1) composed of ammonia ($NH_4OH$), hydrogen peroxide ($H_2O_2$) and deionized water ($DI—H_2O$).

SUMMARY OF THE INVENTION

To solve one or more of the above-described problems, it is an object of the present invention to provide a cleaning solution which can removes polymers and particles with a single cleaning process without eroding metal layers.

It is another object of the present invention to provide a cleaning method for a semiconductor device using the cleaning solution.

To accomplish the first object, there is provided a cleaning solution used in cleaning metal layers of a semiconductor device, the solution being composed of aqueous ammonia ($NH_4OH$), methanol ($CH_3OH$), hydrofluoric acid (HF) and deionized water ($DI—H_2O$).

The mixture ratio of the cleaning solution of $NH_4OH$, $CH_3OH$ and $DI—H_2O$ is respectively, 1 to 1–50 to 0.1–50 by volume. The mixture ratio of HF to the mixture solution of $NH_4OH$, $CH_3OH$ and $DI—H_2O$ is 1–10,000 ppm to 1.

To accomplish the second object of the present invention, there is provided a method for cleaning metal layers on a semiconductor substrate, the method comprising the step of cleaning the semiconductor substrate having the metal layers formed thereon, using a cleaning solution composed of aqueous ammonia ($NH_4OH$), methanol ($CH_3OH$), hydrofluoric acid (HF) and deionized water ($DI—H_2O$).

The temperature of the cleaning solution is 20°–100° C. and is preferably 45° C. The cleaning time during the cleaning step is 8 hours or less and is preferably 10 minutes or less. Also, the metal layers are made of double layers of titanium or titanium nitride, and aluminum alloy.

BRIEF DESCRIPTION OF THE DRAWINGS

The above objects and advantages of the present invention will become more apparent by describing in detail a preferred embodiment thereof with reference to the attached drawings in which:

FIG. 2 is a chart illustrating pictures that compare the particle stripping capabilities of cleaning solutions according to the conventional art and present invention, respectively;

DETAILED DESCRIPTION OF THE INVENTION

The cleaning solution according to the present invention is composed of aqueous ammonia ($NH_4OH$), methanol ($CH_3OH$), hydrofluoric acid (HF) and deionized water ($DI—H_2O$).

The aqueous ammonia has 1–50% purity, the methanol has 90–100% purity and the hydrofluoric acid has 1–60% purity. Also, the mixture ratio of the cleaning solution $NH_4OH:CH_3OH:DI—H_2O$ by volume is 1:1–50:0.1–50. The volume of HF is 1–10,000 ppm with respect to the mixture solution of $NH_4OH$, $CH_3OH$ and $DI—H_2O$.

The corrosion and the polymer and particle stripping capabilities will now be described when the semiconductor substrate having metal layers formed thereon is cleaned using the cleaning solution according to the present invention.

Figure 1:
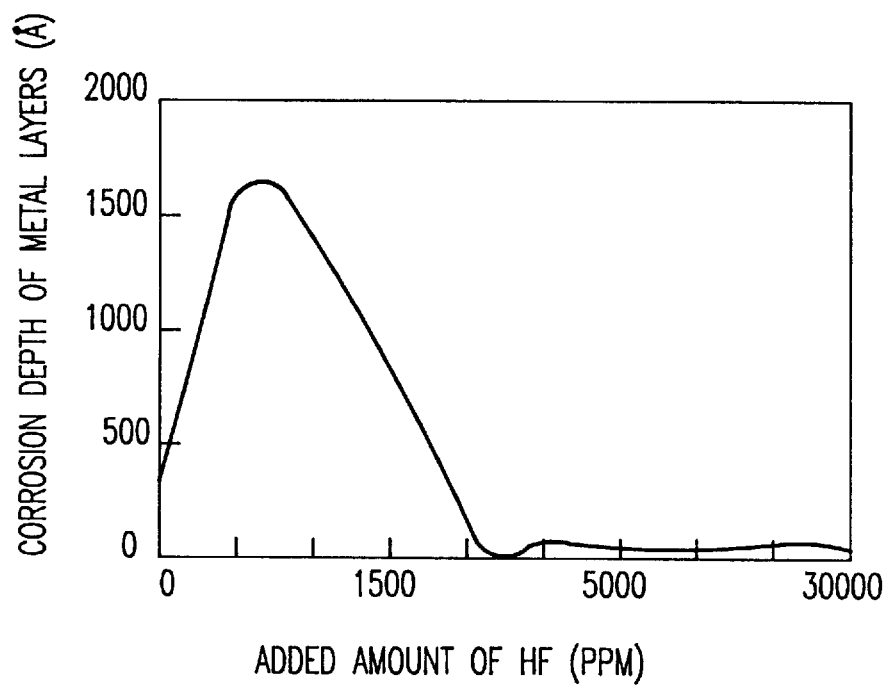
FIG. 1 is a graph showing the corrosion of metal layers depending on the composition of a cleaning solution according to the present invention.

FIG. 1 is a graph showing the corrosion of metal layers depending on the composition of a cleaning solution according to the present invention.

In detail, FIG. 1 shows the corrosion depending on the added amount of HF in the case when the semiconductor substrate having metal layers formed thereon is cleaned with the cleaning solution made of the mixture solution of $NH_4OH$, $CH_3OH$ and $DI—H_2O$ in the volume ratio of 1:10:1 and 500–30,000 ppm of HF added thereto. In FIG. 1 the X axis represents the added amount of HF and the Y axis represents the corrosion depth of the metal layers. The corrosion depth of the metal layers increases until the added HF reaches about 600–700 ppm, but gradually decreases thereafter. If the added amount of HF exceeds about 2,000 ppm, the corrosion depth of the metal layers becomes almost zero. Such reactions can be explained in the following relationships:

$$NH_4OH \rightarrow NH_4^+ + OH^- \quad (1)$$

$$HF \rightarrow H^+ + F^- \quad (2)$$

$$F^-(aq.) + H_2O \leftrightharpoons NH_4^+ + OH^- + HF \text{ (under NH}_3 \text{ atmosphere)} \quad (3)$$

In (1) and (2), $$\leftrightharpoons NH_4^+ + F^- + H^+ + OH^-$$

$$\leftrightharpoons NH_4F + H_2O$$

In relationship (3), fluoride ions ($F^-$) react with water ($H_2O$) to induce hydroxyl ions ($OH^-$), but the reaction direction will change, either forward or backward, depending on the amount of hydrofluoric acid (HF) under the $NH_3$ atmosphere. Specifically, under the $NH_3$ atmosphere, if the amount of HF is trivial (600–700 ppm or less), the reaction occurs forwardly to produce hydroxyl ions. However, if HF is increased (to 600–700 ppm or more), the reaction occurs backwardly to reduce hydroxyl ions (an $OH^-$ annihilation reaction). Therefore, as the amount of HF is increased, the presence of hydroxyl ions is decreased, thereby reducing the corrosion of metal layers.

Figure 2:
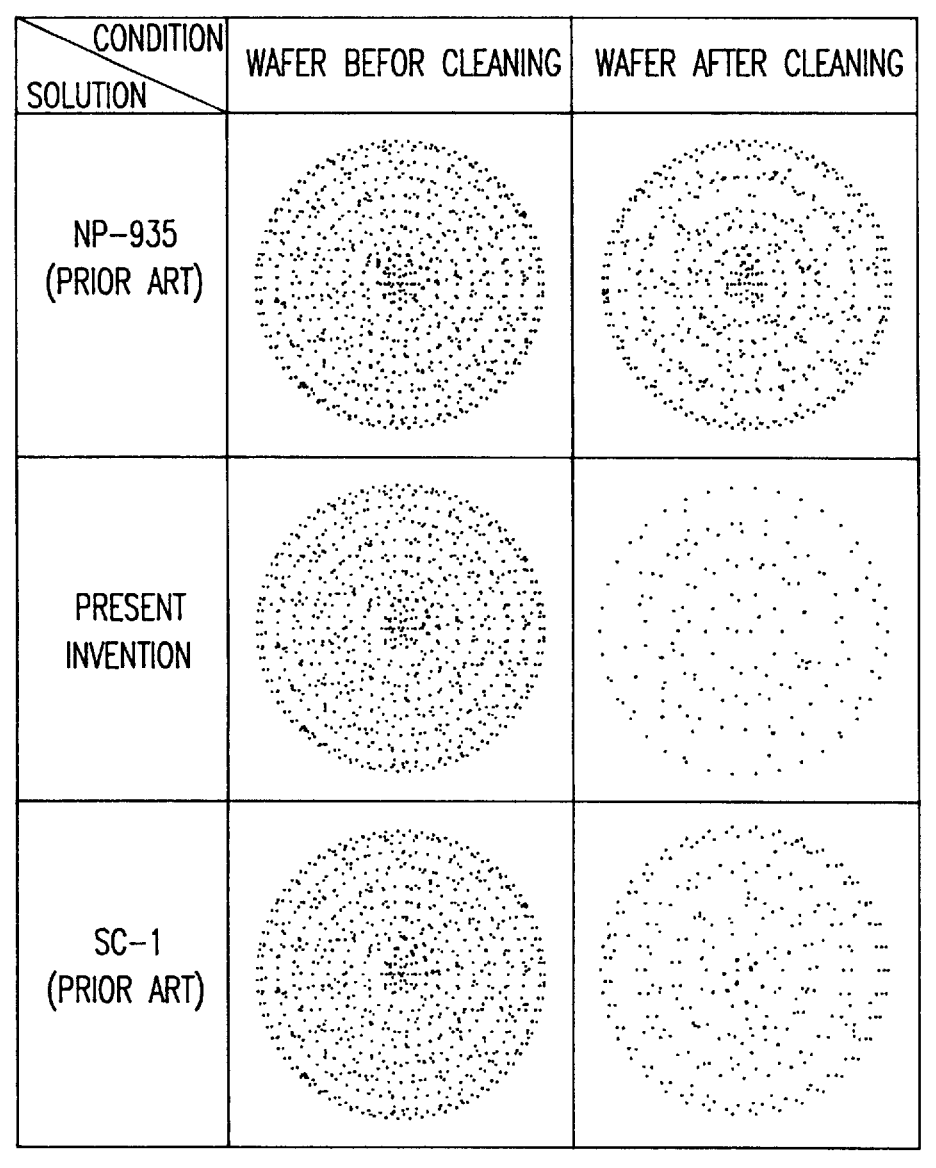

FIG. 2 illustrates pictures for comparing the particle stripping capabilities of cleaning solutions according to the conventional art and present invention.

In detail, the particle stripping capabilities of the cleaning solution of the present invention were compared to the conventional cleaning solutions NP-935 and SC-1. The particle stripping capability of the conventional cleaning solution NP-935 was only about 10%, while the cleaning solution according to the present invention was 80%. Also, the particle stripping capability of the cleaning solution according to the present invention is essentially similar, although somewhat better, than that of SC-1, which had the best stripping capability among the conventional cleaning solutions.

Figure 3:
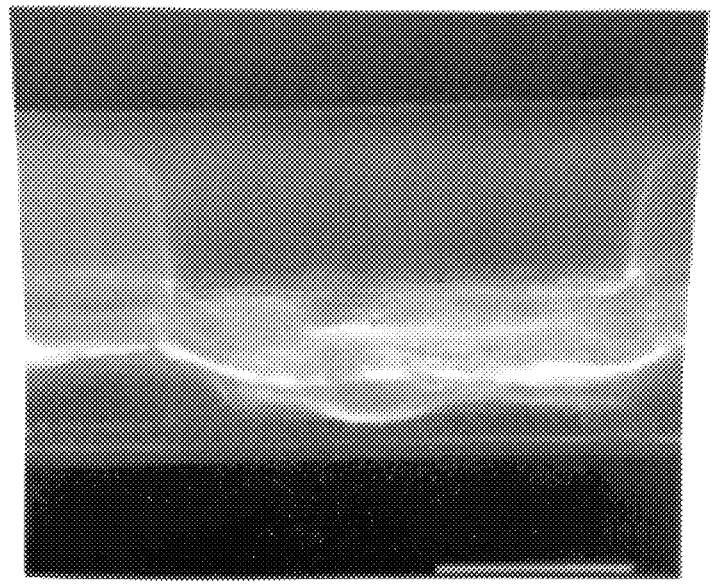
FIGS. 3 and 4 are scanning electron microscopy (SEM) pictures for comparing the polymer stripping capabilities of cleaning solutions according to the conventional art and present invention, respectively.
Figure 4:
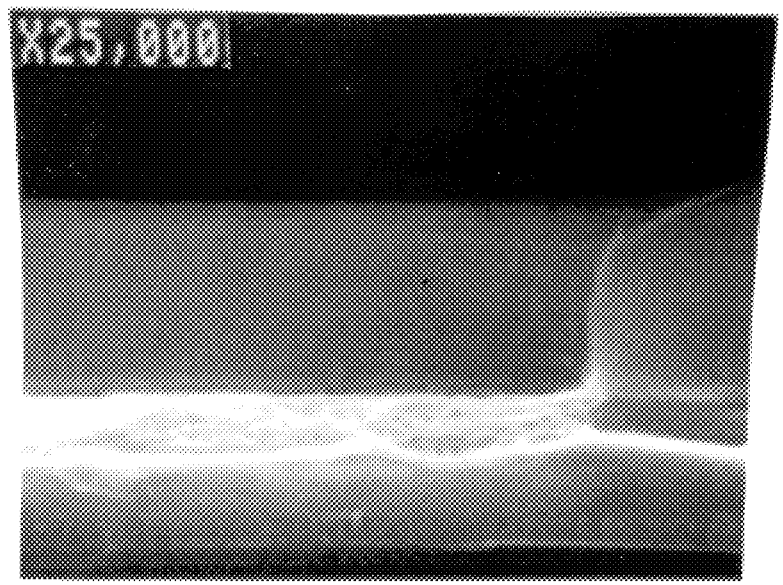

FIGS. 3 and 4 are scanning electron microscopy (SEM) pictures for comparing the polymer stripping capabilities of cleaning solutions according to the conventional art and present invention, respectively.

In detail, polymers are generated during etching metal layers by a dry etching process. If the polymers are not removed even after removing a photoresist, they exert an adverse influence on the follow-on deposition process for the metal layers, that is, the contact resistance is increased. Therefore, the polymers must be removed. If the substrate having metal layers formed thereon is cleaned with the cleaning solution according to the present invention, the polymer stripping capability of the cleaning solution according to the present invention is much higher (FIG. 4) than that of the conventional cleaning solution NP-935 depicted in FIG. 3.

Moreover, the NP-935 cleaning solution is generally processed at a temperature of 70° C. for more than 30 minutes. The cleaning solution must then be rinsed for about three minutes using isopropyl alcohol and deionized water. As a result, the NP-935 cleaning process requires a long processing time.

On the contrary, the cleaning method according to the present invention requires only one to ten minutes for the rinsing process and an additional ten minutes for a rotational dry process at a temperature of 20° C.–100° C., preferably 45° C. Accordingly, the cleaning processing time can be shortened by more than ten minutes.

The hydrogen ion concentration of the cleaning solution as it relates to the stripping particles and pit corrosion density over time will now be described.

Figure 5:
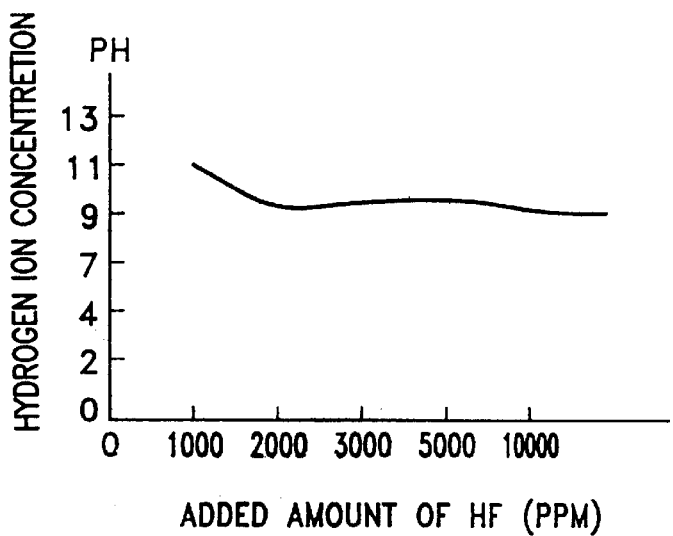
FIG. 5 is a graph showing the concentration of hydrogen ions of the cleaning solution according to the present invention.

FIG. 5 is a graph showing the hydrogen ion concentration (pH) of the cleaning solution according to the present invention.

In detail, when the volume ratio of $NH_4OH$ to $CH_3OH$ to DI—$H_2O$ is 1:10:1, the hydrogen ion concentration (pH) depending on the added amount of HF is shown in FIG. 5. Before adding HF, the pH was about 11. As HF was added, the pH gradually decreased to about 9 when about 10,000 ppm of HF was added. The most suitable pH for stripping particles is known to be 9–10. Therefore, the pH of the cleaning solution according to the present invention is suitable for this purpose.

Figure 6:
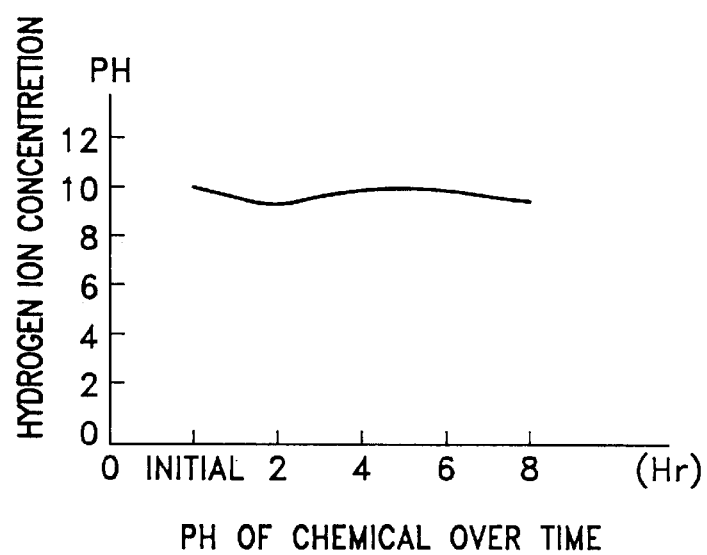
FIG. 6 is a graph showing the change in the concentration of hydrogen ions over time in the cleaning solution according to the present invention.

FIG. 6 is a graph showing the change in the concentration of hydrogen ions over time in the cleaning solution according to the present invention.

In detail, the change of pH was tested over time starting from manufacturing the cleaning solution according to the present invention. Referring to FIG. 6, it can be seen that there is no appreciable change in pH, even though eight hours have elapsed since the cleaning solution was manufactured. More specifically, an initial pH of 9.6 decreased to 9.2 after eight hours. In other words, the cleaning solution performs its function fully within eight hours. After eight hours, the compositions of the solution evaporate considerably. After eight hours, therefore, it is preferable to add more cleaning solution comprised of the respective compositions of the present invention as described above.

Figure 7:
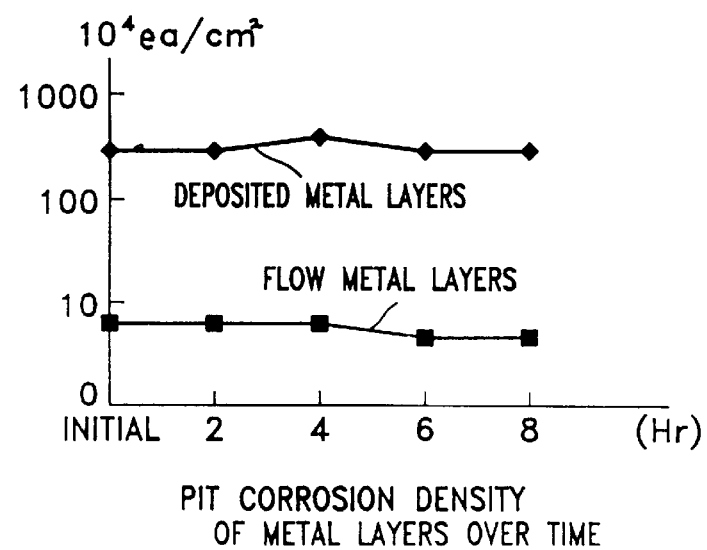
FIG. 7 is a graph showing the pit corrosion density over time in the cleaning solution according to the present invention.

FIG. 7 is a graph showing the pit corrosion density in the cleaning solution over time according to the present invention.

In detail, samples having metal layers are dipped in the cleaning solution according to the present invention and the pit corrosion density thereof was observed for eight hours. Pit corrosion is a corrosion phenomenon whereby specific parts are locally taken away at the particle boundary of metal. As illustrated in FIG. 7, there is little change in the pit density within eight hours, which is the available effective time of the cleaning solution. The samples used in the present invention were deposited metal layers and flow metal layers. The two types of metal layers do not differ in their characteristics, but the flow metal layers are about ten times greater than the deposited metal layers in the size of the particle boundary. The metal layers are made of double layers of titanium or titanium nitride, and aluminum alloy.

In summary, the cleaning solution according to the present invention has a polymer stripping capability that is vastly superior to that of the conventional NP-935, and has a particle stripping capability equivalent to or slightly better than that of the conventional SC-1. Therefore, rather than have two conventional processes being performed separately as in the past, the present inventive method and cleaning solution provide a single, simplified cleaning process.

Moreover, the cleaning solution according to the present invention can be manufactured by simply mixing the respective compositions. Also, the cleaning solution according to the present invention can strip polymers and particles within a much shorter time, without etching or damaging the cleaned metal layers. Therefore, since the cleaning process of a semiconductor device is simplified, the processing cost is reduced and the yield and reliability are improved.

While the present invention has been described in detail, this description is not intended to be construed in a limiting sense. Upon reference to this description, various modifications of the illustrative embodiment, as well as other embodiments of the invention, will be apparent to persons skilled in the art.

What is claimed is:

1. A cleaning solution used in cleaning metal layers of a semiconductor device, wherein said cleaning solution comprises:

a liquid mixture of aqueous ammonia ($NH_4OH$), methanol ($CH_3OH$), hydrofluoric acid (HF) and deionized water (DI—$H_2O$), the volume ratio of $NH_4OH$ to $CH_3OH$ to DI—$H_2O$ being 1:1–50:0.1–50, and the volume of HF being 1–10,000 ppm with respect to the mixture solution of $NH_4OH$, $CH_3OH$ and DI—$H_2O$.

2. A method for cleaning a semiconductor device comprising metal layers, said method comprising the step of cleaning said semiconductor substrate having said metal layers formed thereon, applying a cleaning solution composed of aqueous ammonia ($NH_4OH$), methanol ($CH_3OH$), hydrofluoric acid (HF) and deionized water (DI—$H_2O$) to the metal layers.

3. A cleaning method for a semiconductor device as claimed in claim 2, wherein the duration of said cleaning step is about 1–10 minutes.

4. A cleaning method for a semiconductor device as claimed in claim 3, said cleaning step further comprising a rotational dry processing step, carried out at a temperature of about 20°–100° C.

5. A cleaning method for a semiconductor device as claimed in claim 4, wherein said rotational dry processing step is carried out at a temperature of 45° C.

6. A cleaning method for a semiconductor device as claimed in claim 5, wherein said rotational dry processing step is performed for about 10 minutes.

7. A cleaning method for a semiconductor device as claimed in claim 2, wherein said metal layers are made of double layers of titanium and aluminum alloy.

8. A cleaning method for a semiconductor device as claimed in claim 2, wherein said metal layers are made of double layers of titanium nitride and aluminum alloy.

* * * * *